(12) United States Patent
Driscoll

(10) Patent No.: US 7,146,528 B2
(45) Date of Patent: Dec. 5, 2006

(54) SIMPLE FAULT TOLERANCE FOR MEMORY

(75) Inventor: Kevin Raymond Driscoll, Maple Grove, MN (US)

(73) Assignee: Honeywell International Inc., Morristown, NJ (US)

(*) Notice: Subject to any disclaimer, the term of this patent is extended or adjusted under 35 U.S.C. 154(b) by 380 days.

(21) Appl. No.: 10/716,984

(22) Filed: Nov. 18, 2003

(65) Prior Publication Data

US 2004/0153744 A1 Aug. 5, 2004

Related U.S. Application Data

(63) Continuation of application No. 09/766,073, filed on Jan. 19, 2001, now Pat. No. 6,678,836.

(51) Int. Cl.
*G06F 11/00* (2006.01)

(52) U.S. Cl. .......................... 714/8; 711/209

(58) Field of Classification Search .............. 711/209; 714/8
See application file for complete search history.

(56) References Cited

U.S. PATENT DOCUMENTS

| | | |
|---|---|---|
| 3,644,902 A | 2/1972 | Beausoleil |
| 3,765,001 A | 10/1973 | Beausoliel |
| 3,781,826 A | 12/1973 | Beausoleil |
| 3,897,626 A | 8/1975 | Beausoliel |
| 4,028,539 A | 6/1977 | Jacobs |
| 4,453,248 A | 6/1984 | Ryan |
| 4,461,001 A | 7/1984 | Bossen et al. |
| 4,489,403 A | 12/1984 | Bond |
| 4,506,364 A | 3/1985 | Aichelmann, Jr. et al. |
| 4,520,453 A | 5/1985 | Chow |
| 4,534,029 A | 8/1985 | Singh et al. |
| 4,649,476 A | 3/1987 | Sibigtroth |
| 5,067,105 A | 11/1991 | Borkenhagen et al. |
| 5,123,101 A | 6/1992 | Sindhu |
| 5,253,350 A | 10/1993 | Foster et al. |
| 5,253,354 A | 10/1993 | MacDonald et al. |
| 5,455,834 A | 10/1995 | Chang et al. |
| 5,541,938 A | 7/1996 | Di Zenzo et al. |
| 5,838,893 A * | 11/1998 | Douceur ..................... 714/7 |
| 5,937,436 A | 8/1999 | Dobbek et al. |
| 5,943,283 A | 8/1999 | Wong et al. |
| 5,991,517 A | 11/1999 | Harari et al. |
| 5,999,480 A | 12/1999 | Ong et al. |
| 6,338,153 B1 | 1/2002 | Sasaki et al. |
| 6,535,995 B1 | 3/2003 | Dobbek |

FOREIGN PATENT DOCUMENTS

EP 0 146 891 7/1986

OTHER PUBLICATIONS

Mano et al., Logic and Computer Design Fundamentals, 1997, Prentice-Hall Inc., pp. 74-78.*

* cited by examiner

*Primary Examiner*—Robert Beausoliel
*Assistant Examiner*—Michael Maskulinski
(74) *Attorney, Agent, or Firm*—Fogg & Associates, LLC; David N. Fogg

(57) ABSTRACT

Methods and an associated apparatus are disclosed for providing fault tolerance for memory. The method involves generating a remapping value. Then the remapping value may be logically combined with the address value intended for accessing a given memory location to remap the bad address to an unused address.

20 Claims, 2 Drawing Sheets

SIMPLE FAULT TOLERANCE FOR MEMORY

CROSS REFERENCE TO APPLICATION

This application is a continuation of application Ser. No. 09/766,073 (U.S. Pat. No. 6,678,836) filed on Jan. 19, 2001 and entitled "SIMPLE FAULT TOLERANCE FOR MEMORY" (the '836 Application). The '836 Application is incorporated herein by reference.

TECHNICAL FIELD

The present invention relates to fault tolerance for memory such as solid-state memory or other memory that may utilize flat memory space such as some disk drives, and more particularly to remapping of faulty memory addresses.

BACKGROUND

Whether memory be embodied in dedicated chips, be integrated into multi-purpose chips, or even be embodied in a disk drive utilizing flat memory space rather than cylinder/sector addressing, it may have locations that fail over time or are faulty at the time of manufacture. However, the majority of locations in the memory typically remain usable. Thus, methods have been devised to compensate for the faulty locations so that the use of the non-faulty locations may continue.

The conventional methods for fault tolerance include adding dedicated spare rows, columns, chips, modules, etc. that provide storage locations that substitute for the faulty locations. The dedicated spares are wasted unless there is a fault requiring a substitution. Other methods include permuting bits within words stored in the memory. These are complex schemes that do not allow memory components of more than one bit width to be used. Large granularity reconfiguration methods may be used whereby a group of locations containing one or more defective locations are disabled but more than the faulty memory area is left unusable.

Other methods include reconfiguring the faulty location to a predetermined location that is blocked. If access to the predetermined location is ever needed for additional storage, the reconfiguration fails. Methods involving arranging the circuitry of devices so that the faulty locations are avoided have been implemented. However, this is only performed during manufacturing and is inapplicable in the field. Other methods shuffle the address bits or fully permute the data, but these methods are more complex.

Accordingly, there is a need for simple fault tolerance for memory.

SUMMARY

The present invention may be viewed as a method for remapping locations in memory. The method involves generating a remapping value. The remapping value is logically combined with an intended address value to generate a remapped address value. A memory location having the remapped address value is then accessed.

The present invention may also be viewed as a system for remapping locations in memory. The system includes a first logic configured to generate a remapping value. A second logic is also included and is configured to combine the remapping value with an intended address value to generate a remapped address value. The system also includes a memory address input configured to access a memory location having the remapped address value.

DETAILED DESCRIPTION

Figure 1:
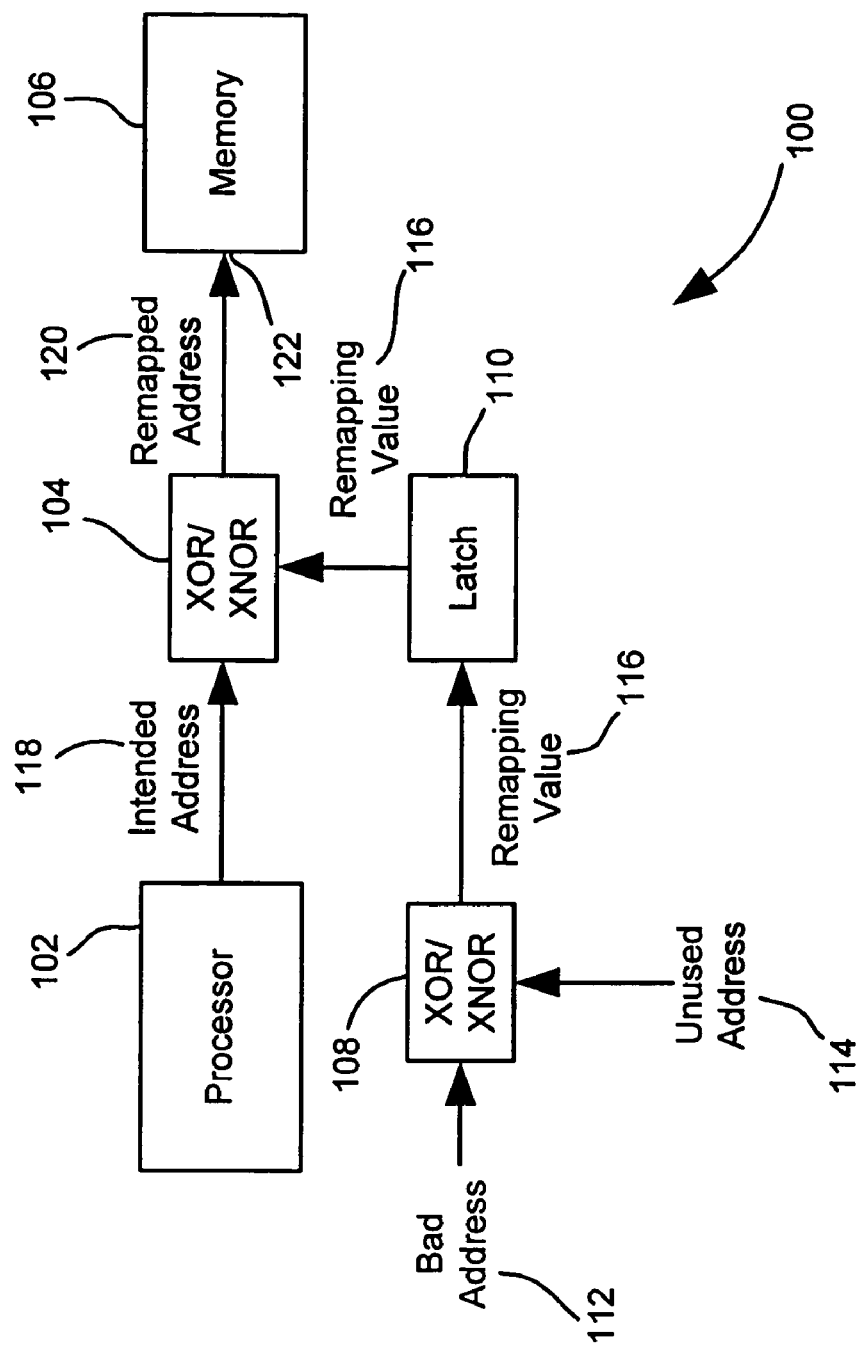
FIG. 1 shows an exemplary system for remapping locations in memory.

Various embodiments of the present invention will be described in detail with reference to the drawings, wherein like reference numerals represent like parts and assemblies through the several views. Reference to various embodiments does not limit the scope of the invention, which is limited only by the scope of the claims attached hereto.

Embodiments of the present invention provide a simplified fault tolerance scheme whereby a memory location that is known to be unused for a particular instance is logically combined with a memory location that is known to be faulty. A remapping value that results can then be logically combined with a memory address output by a device, such as a processor, that is intended for storage of data to remap to a different location. Thus, when the device outputs an intended address that is equal to the bad address, the intended address is logically combined with the remapping address and the associated data is steered to a different otherwise unused memory location.

FIG. 1 illustrates an exemplary embodiment of the fault tolerance system 100. The electronic device, such as a computer system, utilizing the fault tolerance system will typically include a processor 102 and a rewriteable memory device 106 such as RAM, EPROM, etc having one or more inputs 122. The system also includes a logic 104 and another logic 108. The system may also include a latch 110. The logic 104 and logic 108 may be implemented in hardware or software. Because the logic 108 is typically used only once per period of operation of the memory, it may be implemented in software without degrading performance. However, the logic 104 may be used for every memory access and, therefore, it sometimes is preferred to implement logic 104 in hardware.

Figure 2:
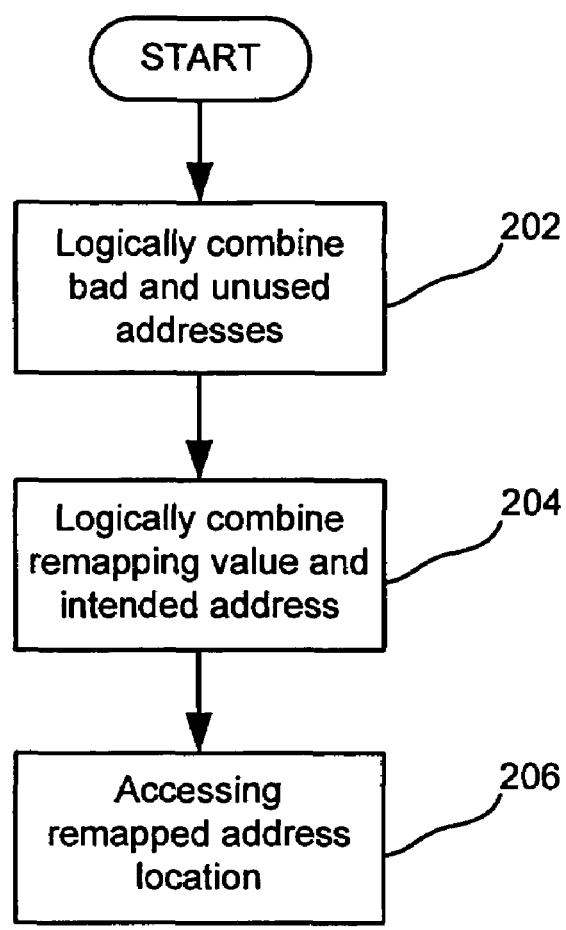
FIG. 2 shows the operational flow of the exemplary system for remapping locations in memory.

As shown in FIG. 2, the exemplary process is as follows. The address value 112 that is for the memory location known to be bad is provided to the logic 108. The address value 114 for the memory location that is known to be unused is also provided to the logic 108. Logic 108 then combines the two address values at first logic operation 202 of FIG. 2 to produce a remapping value 116. Alternatively, at first logic operation 202, a remapping value may be otherwise chosen, such as where the system always sets aside a certain location or range as being unused and the remapping value may be set to the bad address value. For example, if the zero address is set aside as always being unused, the remapping value may be generated by simply using the bad memory address as the remapping value. In this case, logic 108 may be configured to output the bad address value as the remapping value. The remapping value may be stored in latch 110.

Logic 104 intercepts the intended address value 118 output by the processor 102 that would normally indicate the location where the data would be stored. Ordinarily, the intended address value 118 would be provided directly to input 122 of memory 106. The logic 104 also receives remapping value 116. The intended address value 118 is logically combined with the remapping value 116 at second logic operation 204 to result in the remapped address value 120.

The remapped address value 120 is then supplied to input 122 of memory 106 to steer access by the processor 102 to a non-faulty location within memory 106 at access operation 206. The accessing of memory may be for reading or writing purposes. Once data has been written to memory 106 using the fault tolerance system 100 with a fixed (i.e., latched) remapping value 118, utilizing the same intended address value 118 associated with a desired data will result in accessing the correct remapped value location in memory 106 that contains the desired data.

The bad memory address value 112 and the unused memory address value 114 may each correspond to an individual data location in memory. This is true when there is only one bad address value for a distinct portion of the memory. An example is provided below in Table A. As shown in the example, all addresses are remapped.

TABLE A

| Processor (Intended) Address | | | Remapped Address | | |
|---|---|---|---|---|---|
| Decimal | Binary | Data | Decimal | Binary | Data |
| 15 | 1111 | xxxxxx | 5 | 0101 | xxxxxx |
| 14 | 1110 | xxxxxx | 4 | 0100 | xxxxxx |
| 13 | 1101 | bad and needed | 7 | 0111 | bad and unused |
| 12 | 1100 | xxxxxx | 6 | 0110 | xxxxxx |
| 11 | 1011 | xxxxxx | 1 | 0001 | xxxxxx |
| 10 | 1010 | xxxxxx | 0 | 0000 | xxxxxx |
| 9 | 1001 | xxxxxx | 3 | 0011 | xxxxxx |
| 8 | 1000 | xxxxxx | 2 | 0010 | xxxxxx |
| 7 | 0111 | otherwise unused | 13 | 1101 | utilized |
| 6 | 0110 | xxxxxx | 12 | 1100 | xxxxxx |
| 5 | 0101 | xxxxxx | 15 | 1111 | xxxxxx |
| 4 | 0100 | xxxxxx | 14 | 1110 | xxxxxx |
| 3 | 0011 | xxxxxx | 9 | 1001 | xxxxxx |
| 2 | 0010 | xxxxxx | 8 | 1000 | xxxxxx |
| 1 | 0001 | xxxxxx | 11 | 1011 | xxxxxx |
| 0 | 0000 | xxxxxx | 10 | 1010 | xxxxxx |

As shown in Table A, address location 13 is bad and therefore unusable, but a processor program has designated that data will be stored in location 13. The processor gram has designated that location 7 will be unused. Therefore, to remap the bad location to the good location, the binary address value (1101) for location 13 is XORed with the binary address value (0111) for location 7 to produce a remapping value 1010. The remapping value is then XORed with each intended address from the processor 102 to produce a remapped address. Thus, when the processor outputs 1101 for bad location 13, the remapped value becomes 0111 which directs data for location 13 to location 7 which was previously deemed unused. An alternative to remapping every location is to only remap the bad address to the unused address by using a comparator to apply the logic 104 to the intended address only when the intended address is the bad address.

The present invention can be applied to other scenarios than where a single location is bad. The invention is applicable anytime an unused value can be combined with a bad value to produce a remapping value that will always remap bad locations to unused locations. Table B below shows an example where two contiguous bad locations and two contiguous unused locations exist.

TABLE B

| Processor (Intended) Address | | | Remapped Address | | |
|---|---|---|---|---|---|
| Decimal | Binary | Data | Decimal | Binary | Data |
| 15 | 1111 | xxxxxx | 5 | 0101 | xxxxxx |
| 14 | 1110 | xxxxxx | 4 | 0100 | xxxxxx |
| 13 | 1101 | bad and needed | 7 | 0111 | bad and unused |
| 12 | 1100 | bad and needed | 6 | 0110 | bad and unused |
| 11 | 1011 | xxxxxx | 1 | 0001 | xxxxxx |
| 10 | 1010 | xxxxxx | 0 | 0000 | xxxxxx |
| 9 | 1001 | xxxxxx | 3 | 0011 | xxxxxx |
| 8 | 1000 | xxxxxx | 2 | 0010 | xxxxxx |
| 7 | 0111 | otherwise unused | 13 | 1101 | utilized |
| 6 | 0110 | otherwise unused | 12 | 1100 | utilized |
| 5 | 0101 | xxxxxx | 15 | 1111 | xxxxxx |
| 4 | 0100 | xxxxxx | 14 | 1110 | xxxxxx |
| 3 | 0011 | xxxxxx | 9 | 1001 | xxxxxx |
| 2 | 0010 | xxxxxx | 8 | 1000 | xxxxxx |
| 1 | 0001 | xxxxxx | 11 | 1011 | xxxxxx |
| 0 | 0000 | xxxxxx | 10 | 1010 | xxxxxx |

As shown, both locations 12 and 13 are bad and locations 6 and 7 are unused. Thus, the binary address 110x (where x means the bit value can be either 0 or 1) is XORed with 011x to produce a remapping value 101x or 1010. This remapping value is then applied to each intended address to remap it. Bad address 13 is then remapped to location 7, and bad address 12 is remapped to location 6.

The present invention may also be applied to situations other than where individual locations are considered. For example, if an entire page of memory is bad and an entire page is unused, the bad page address may be logically combined with the unused page address to create a remapping value which then can be logically combined with the page address output by the processor to remap the bad page to the unused page.

Furthermore, it may be advantageous to apply the invention to a subset of memory such as remapping a lower set of addresses by logically combining the least significant bit(s) of the address values. For example, if the bad address value is in location 2 and the unused address value is for location 0, the subset of locations 0–3 may be remapped by logically combining the two least significant bits rather than the full address. This is beneficial where memory already contains data in the one subset where the bad address is not present and those locations of the subset without the bad address are not remapped. Because they are not remapped, the data contained in those locations remains addressable as normal and does not require reloading the data.

The first logic 108 and the second logic 104 may be an XOR gate, an XNOR gate, or possibly other devices providing similar logical combinations. The logic gates 104 an 108 as well as latch 110 may be built-in fault management hardware for the processor 102, as an intermediate device between the processor 102 and the memory chip 106, or as a built-in fault management hardware for the memory chip 106. To achieve the best performance, it may be preferred that the gates and latch be provided on the processor or memory chip.

Providing the bad address 112 to the logic 108 may be done by detecting a faulty position through ordinary procedures such as parity, EDAC, or checkerboard tests and then passing that value to the gate. As mentioned, the remapping value may be chosen such as by using the bad address value as the remapping value when a fixed range of the memory is always allocated as unused. Where a fixed range is not always set aside as unused as unused or when it is desirable to remap to other locations that are unused addresses, the unused address may be provided through ordinary procedures as well. For example, an "end of use" symbol as placed in memory by a software linker/loader may be located to determine one or more unused locations, and then the unused address value is provided to the logic 108.

While the invention has been particularly shown and described with reference to preferred embodiments thereof, it will be understood by those skilled in the art that various other changes in the form and details may be made therein without departing from the spirit and scope of the invention.

What is claimed is:

1. A method for remapping locations in memory, comprising:
    generating a remapping value by logically combining a bad address value with an unused address value;
    logically combining the remapping value with an intended address value to generate a remapped address value, wherein one or more bad memory address values exist and wherein the remapping value is logically combined with only intended address values that equal one of the bad memory address values to generate a remapped address value for only the one or more bad memory address values; and
    accessing a memory location having the remapped address value.

2. The method of claim 1, wherein the bad memory address value, unused memory address value, and the remapped address value correspond to individual data locations.

3. The method of claim 1, wherein the bad memory address value and the unused memory address value each correspond to multiple data locations.

4. The method of claim 1, wherein the bad memory address value, unused memory address value, and the remapped address value correspond to individual memory pages.

5. The method of claim 1, wherein the bad memory address value and the unused memory address value each correspond to multiple memory pages.

6. The method of claim 1, wherein the bad memory address value and the unused memory address value are exclusively-ORed to produce the remapping value.

7. The method of claim 1, wherein the remapping value and the intended address value are exclusively-ORed to produce the remapped address value.

8. The method of claim 1, wherein the bad memory address value and the unused memory address value are exclusively-NORed to produce the remapping value.

9. The method of claim 1, wherein the remapping value and the intended address value are exclusively-NORed to produce the remapped address value.

10. The method of claim 1, wherein the remapping value is latched.

11. A system for remapping locations in memory, comprising:
    a first logic for outputting a remapping value by combining a bad memory address value with an unused memory address value;
    a second logic configured to combine the remapping value with an intended address value to generate a remapped address value, wherein one or more bad address values exist and wherein the second logic combines the remapping value with only the intended address value that equals one of the bad memory address values to generate a remapped address value for only the one or more bad memory address values; and
    a memory address input configured to access a memory location having the remapped address value.

12. The system of claim 11, wherein the bad memory address value, unused memory address value, and the remapped address value correspond to individual data locations.

13. The system of claim 11, wherein the bad memory address value and the unused memory address value each correspond to multiple data locations.

14. The system of claim 11, wherein the bad memory address value, unused memory address value, and the remapped address value correspond to individual memory pages.

15. The system of claim 11, wherein the bad memory address value and the unused memory address value each correspond to multiple memory pages.

16. The system of claim 11, wherein the first logic is an exclusive OR gate.

17. The system of claim 11, wherein the second logic is an exclusive OR gate.

18. The system of claim 11, wherein the first logic is an exclusive NOR gate.

19. The system of claim 11, wherein the second logic is an exclusive NOR gate.

20. The system of claim 11, further comprising a latch configured to store the remapping value.

* * * * *